(12) United States Patent
Oggier et al.

(10) Patent No.: US 9,117,712 B1
(45) Date of Patent: Aug. 25, 2015

(54) DEMODULATION PIXEL WITH BACKSIDE ILLUMINATION AND CHARGE BARRIER

(75) Inventors: Thierry Oggier, Zurich (CH); Michael Lehmann, Winterthur (CH)

(73) Assignee: MESA Imaging AG, Zurich (CH)

( * ) Notice: Subject to any disclaimer, the term of this patent is extended or adjusted under 35 U.S.C. 154(b) by 285 days.

(21) Appl. No.: 12/843,583

(22) Filed: Jul. 26, 2010

Related U.S. Application Data

(60) Provisional application No. 61/228,198, filed on Jul. 24, 2009.

(51) Int. Cl.
| | |
|---|---|
| H01L 27/00 | (2006.01) |
| H01L 31/00 | (2006.01) |
| H01J 40/14 | (2006.01) |
| H01L 27/146 | (2006.01) |

(52) U.S. Cl.
CPC ...... *H01L 27/14609* (2013.01); *H01L 27/1463* (2013.01)

(58) Field of Classification Search
CPC ............. H01L 27/14609; H01L 27/1461; H01L 27/1463; H01L 27/144; H01L 27/14612
USPC ........ 250/208.1, 214 R, 214.1; 257/290–292, 257/257, 258, 431; 348/294, 308, 281, 282, 348/283, 302–304
See application file for complete search history.

(56) References Cited

U.S. PATENT DOCUMENTS

| | | | |
|---|---|---|---|
| 5,856,667 | A | 1/1999 | Spirig et al. |
| 6,777,659 | B1 | 8/2004 | Schwarte |
| 6,794,214 | B2 | 9/2004 | Berezin et al. |
| 6,825,455 | B1 * | 11/2004 | Schwarte .................. 250/214.1 |
| 7,166,878 | B2 * | 1/2007 | Janesick et al. ............ 257/290 |
| 7,253,461 | B2 * | 8/2007 | Yang et al. .................... 257/292 |
| 7,436,496 | B2 * | 10/2008 | Kawahito .................... 356/5.01 |
| 7,626,685 | B2 * | 12/2009 | Jin et al. ....................... 356/4.01 |
| 7,781,811 | B2 * | 8/2010 | Kawahito et al. ............ 257/292 |
| 2007/0052050 | A1 * | 3/2007 | Dierickx ....................... 257/432 |

(Continued)

FOREIGN PATENT DOCUMENTS

| | | |
|---|---|---|
| DE | 197 04 496 A1 | 3/1998 |
| DE | 198 21 974 A1 | 11/1999 |

(Continued)

OTHER PUBLICATIONS

Agranov, G., et al., "Pixel Continues to Shrink . . . Pixel Development for Novel CMOS Image Sensors", International Image Sensor Workshop, 2009.

(Continued)

*Primary Examiner* — Que T Le
*Assistant Examiner* — Jennifer Bennett
(74) *Attorney, Agent, or Firm* — Fish & Richardson P.C.

(57) ABSTRACT

A high-speed, high-sensitivity demodulation sensor usable for e.g. time-of-flight application uses a back side illuminated (BSI) image sensor chip, in which the photo-generated charges are first transferred to a demodulation area, from which the charges are then sampled and stored on at least one specific storage node. The storage node is electrically isolated from the sensitive area. Such a pixel might find its use specifically in 3D time-of-flight imaging given its improvements in sensitivity because the presented invention allows to design pixel with up to 100% fill factor and enables charge detection even if the charge generation by the photon occurs deep in the silicon substrate.

10 Claims, 7 Drawing Sheets

(56) References Cited

U.S. PATENT DOCUMENTS

| | | | | |
|---|---|---|---|---|
| 2009/0201400 A1* | 8/2009 | Zhang et al. | | 348/296 |
| 2010/0096675 A1* | 4/2010 | Lauxtermann | | 257/292 |

FOREIGN PATENT DOCUMENTS

| | | | |
|---|---|---|---|
| DE | 10 2006 002 732 A1 | | 2/2007 |
| EP | 1 583 150 A1 | | 10/2005 |
| EP | 1 624 490 A1 | | 2/2006 |
| GB | 2 389 960 A | | 12/2003 |
| KR | 1008708210000 B1 | * | 11/2008 |
| WO | 2006/012761 A1 | | 2/2006 |
| WO | 2007/045108 A1 | | 4/2007 |

OTHER PUBLICATIONS

Buettgen, B., et al., "Demodultion Pixel Based on Static Drift Fields", IEEE Transactions on Electron Devices, Nov. 2006, pp. 2741-2747, vol. 53, No. 11.

Buettgen, B., "Extending Time-of-Flight Optical 3D-Imaging to Extreme Operating Conditions", Ph.D. thesis, University of Neuchatel, 2006.

Gambino, J., et al., "CMOS Image Sensor with High Refractive Index Lightpipe", International Image Sensor Workshop, 2009.

Lange, R., et al., "Solid-State Time-of-Flight Range Camera", IEEE J. Quantum Electronics, Mar. 2001, pp. 390-397, vol. 37, No. 3.

Niclass, C. L., et al., "A CMOS Single Photon Avalanche Diode Array for 3D Imaging", IEEE International Solid-State Circuits Conference (ISSCC), Feb. 2004, pp. 120-121.

Oggier, T., et al., "3D-Imaging in Real-Time with Miniaturized Optical Range Camera", Opto Conference Nurnberg, 2004.

Oggier, T., et al., "An all-solid-state optical range camera for 3D real-time imaging with sub-centimeter depth resolution (SwissRanger TM)", Optical Design and Engineering, Proceedings of the SPIE, 2004, pp. 534-545, vol. 5249.

Oggier, T., et al., "SwissRanger SR3000 and First Experiences Based on Miniaturized 3D-TOF Cameras", 1st Range Imaging Research Day, ETH, Zurich, 2005, 12 pages.

Rhodes, H., et al., "The Mass Production of BSI CMOS Image Sensors", International Image Sensor Workshop, 2009.

Sinha, A., et al., "Effect of back surface field on photocurrent in a semiconductor junction", Solid-State Electronics, 1978, pp. 943-951, vol. 21.

Sinha, A., et al., "Effect of Heavy Doping on the Properties of High-Low Junction", IEEE Transactions on Electron Devices, Dec. 1978, vol. Ed-25, No. 12.

Ushinaga, T., et al., "A QVGA-size CMOS Time-of-Flight Range Image Sensor With Background Light Charge Draining Structure", Three-Dimensional Image Capture and Applications VII, Proceedings of SPIE, 2006, pp. 34-41, vol. 6056.

Van Nieuwenhove, D., et al., "Novel Standard CMOS Detector using Majority Current for guiding Photo-Generated Electrons towards Detecting Junctions", Proceedings Symposium IEEE/LEOS Benelux Chapter, 2005.

* cited by examiner

DEMODULATION PIXEL WITH BACKSIDE ILLUMINATION AND CHARGE BARRIER

RELATED APPLICATIONS

This application claims the benefit under 35 USC 119(e) of U.S. Provisional Application No. 61/228,198 filed on Jul. 24, 2009, which is incorporated herein by reference in its entirety.

BACKGROUND OF THE INVENTION

Three Dimensional (3D) time-of-flight (TOF) cameras are capable of getting range information for all pixels of the TOF detector in real-time. TOF cameras typically include a light source for illuminating the scene with modulated light, usually light emitting diodes (LEDs) or laser diodes, an optical lens system to form an image of the scene on an image sensor, and the image sensor comprising an array of high-speed demodulation pixels.

Other TOF approaches might use single photon avalanche diodes (SPAD) to detect the time of flight. SPADs measure the travel time of the light from the emitter to the object and back to the camera directly, whereas demodulation pixels are measuring the back-reflected phase information or correlation information representing a mean of the measured distance. Hence, the demodulation pixels measure the distance indirectly.

The light sources of TOF cameras usually operate in the near-infra red light spectra, most commonly between 800 and 900 nanometers (nm), which is outside the visible range. Operating in this range is mainly to avoid bright, visible light bothering people in the surroundings of the camera.

General system setups based on demodulation pixels and full 3D TOF camera implementation has been demonstrated in [LAN01] and [OGG04] as well as a description of several applications in [OGG05]. Further, the SPAD-based system approach has been presented in [NIC03].

Demodulation pixels in image sensors have the function to sample and accumulate the charge carriers generated by the incoming photons. During or after this integration time, the collected charge is then converted into a voltage signal, which is then read out.

Demodulation pixels allow sorting the arriving photons or the respective generated charge according to their arrival time. For that they need at least one fast switching element, and, connected to it, at least one dedicated storage or integration region or integration node, called tap. In these storage nodes, the charge corresponding to the time interval of the open switch is stored and is then read out. Based on these samples, the phase or distance is deduced.

One of the main challenges of 3D TOF pixels is to collect and store quickly as many photo-generated electrons as possible in the storage nodes. A common issue is that near-infra red (NIR) photons penetrate deeper in the substrate compared to photons in the visible spectra. Nevertheless, the electrons that are generated in the substrate by the NIR photons still need to be detected and collected and transferred quickly to corresponding storage nodes.

In recent years, the pixel pitch of standard pixel has been shrinking while the stack of layers on top of the photo-sensitive area have been increasing. This creates the challenge to bring the photons impinging on the pixel through all the stack layers into the photo-sensitive area. The efficiency of converting the photon falling onto a pixel into electrons is drastically lowered by adding more layers on top of the substrate.

A state-of-the-art approach to reduce the problem is the use of micro-lenses to improve the conversion rate from photons impinging on the pixel to electrons. However, the use of micro-lenses has limitations as soon as the layer stack gets too big in relation to the pixel pitch.

Micro-lenses combined with in-pixel lightguides further improve the efficiency. The so-called lightpipes direct all photons through the stack onto the sensitive area [GAM09], [AGA09].

Recent developments propose to backthin the substrate and to illuminate the pixel from the backside [RHO09]. This approach results in most designs having a fill factor of up to 100%, since no electronics is shadowing the photo-sensitive are from the impinging photons. The layer stack on top of the substrate can be increased in that case without losing sensitivity.

As in all solid-state image sensors, the incoming photons generate charge carriers, meaning electron-hole pairs within the substrate. These pairs have to be separated by an electric field, e.g. a p+/n+ doped junction. After the separation one type of charge carriers (normally the electron) is stored in a storage element, e.g. a capacitance, whereas the other type of charge carriers is absorbed by the substrate. In image sensors providing a visual representation of the surrounding, the separation is often slow, as the information is stored just in the amount of the generated charge carriers, giving a gray scale or, with the help of color filters, a color image.

In demodulation pixels, e.g. used for time-of-flight applications, the amount of generated charge carriers is not the main information one is interested in. Instead, the arriving time has to be measured. For this, the separation stage must distinguish the charge carriers depending on their arrival time. Therefore the collection of the charge carriers has to be fast. For this, drift fields are necessary to transfer the carriers to the point through the demodulation region into the corresponding storage node.

The first demodulation pixels, which are mainly dominated by electron diffusion transfer, have been described in [SPI99]. Based on this approach, several prototypes have been built [LAN01], [KAW06], [KAU04]. A similar demodulation principle has been described in [SCH99].

However, in order to improve 3D TOF imaging based on demodulation pixels, a higher electron transfer speed from the sensitive area to the storage nodes is essential if not even required. High speed electron transfer is mainly achieved by applying electric fields across the sensitive area to the storage node. Demodulation pixels based on pure drift transfer have been described in [SEI02], [BUE05B], [NIE05].

All these methods perform demodulation directly in the photo-sensitive area. A new approach separating the sensitive area from the demodulation area but keeping a drift-dominated electron transfer is described in [BUE05A].

SUMMARY OF THE INVENTION

The novel 3D TOF technology presented herein addresses several performance issues from which state-of-the-art 3D TOF pixel suffer from, namely the pixel fill factor and the quantum efficiency, both contributing to a higher pixel sensitivity.

The invention disclosed herein provides an enhancement of prior-art demodulation pixels in terms of sensitivity and depending on the implementation, in terms of speed.

The sensitivity is increased by the fill factor, which can reach up to 100%, and the capability of capturing photo-generated charges deep in the silicon, hence increasing quantum efficiency (QE) for long wavelengths.

In general according to one aspect, the invention features a demodulation sensor with back side illumination comprising an array of pixels, usually a two dimensional array. Each of the pixels comprises a photo-sensitive area for receiving photons which are transferred to a demodulation area, a switching element that directs said electrons from said demodulation area to alternative storage areas, and a charge barrier to prevent said electrons from flowing from said sensitive area to said storage areas.

In general according to one aspect, the invention features a demodulation sensor with back side illumination comprising an array of pixels, such as a two dimensional array. Each of the pixels comprises a photo-sensitive area for receiving photons which are transferred to a demodulation area, a switching element that directs said electrons from said demodulation area to alternative storage areas, and a lens to direct said photons toward the demodulation area.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
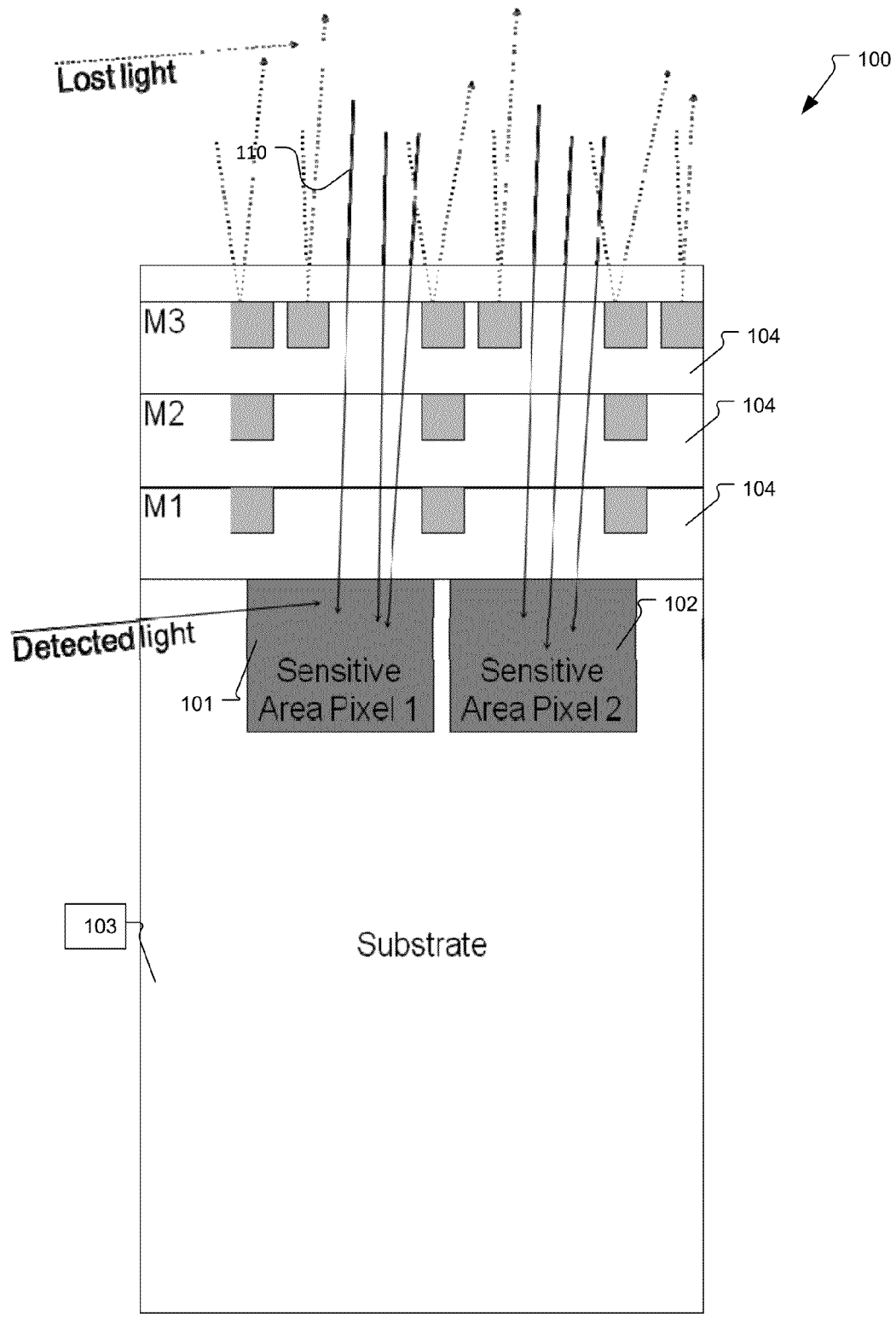
FIG. 1 is a diagram illustrating a front side illuminated pixel with a low fill factor.

A drawback of state-of-the-art TOF pixels is that the pixels 101, 102 suffer from quite a low fill factor. This is mainly due to the electrical circuits required in the TOF pixel. A front side illuminated (FSI) sensor 100 with such a low fill factor is illustrated in FIG. 1. The metal layers 104 cover part of the pixel area and hinder the arriving photons 110 to reach the sensitive areas 101, 102.

Figure 2:
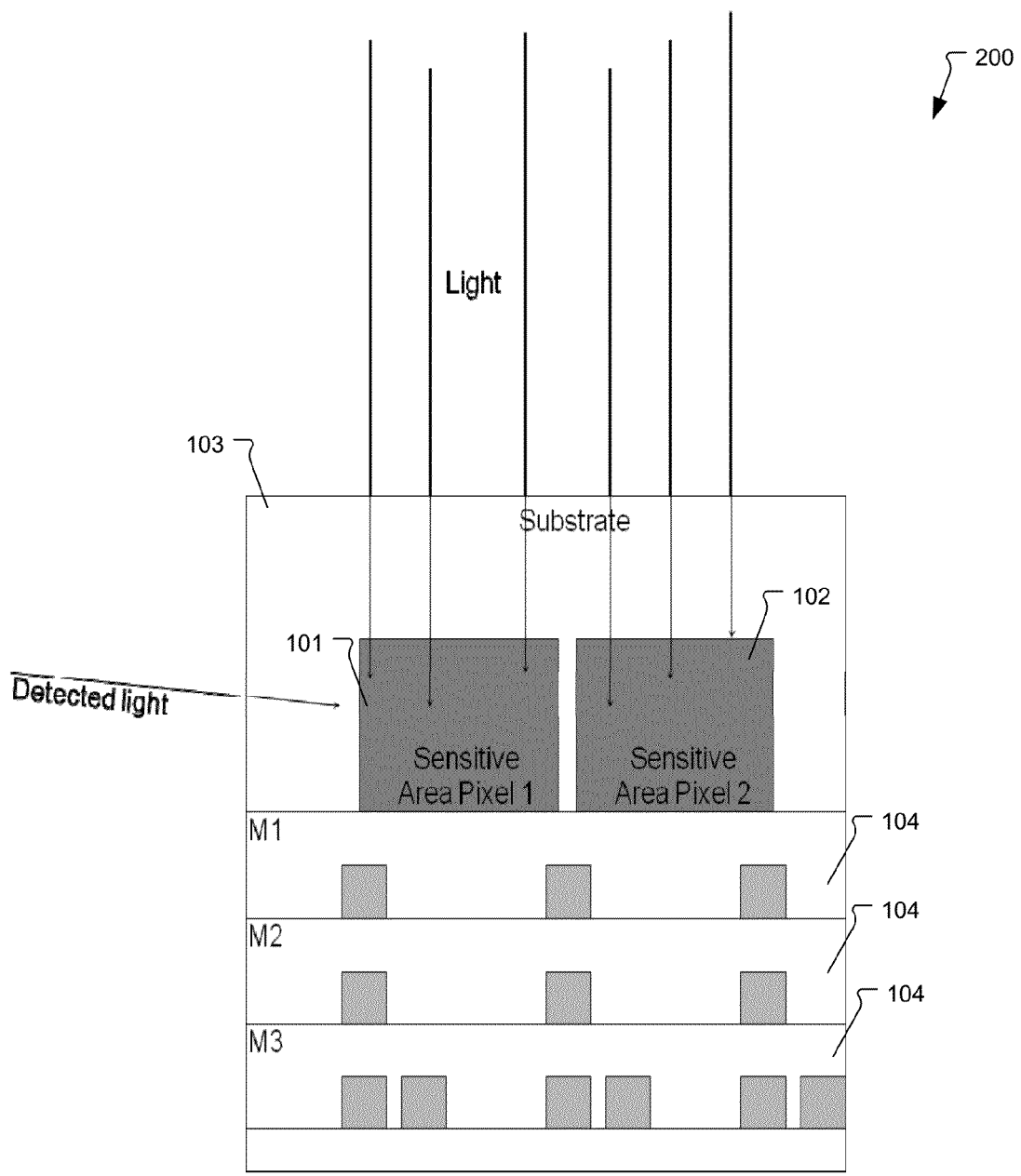
FIG. 2 is a diagram illustrating a back side illuminated pixel with an increased fill factor.

FIG. 2 illustrates a back side illuminated (BSI) senor 200, which has increased fill factor since the effective are of the sensitive areas 101 and 102 is larger.

A second drawback of 3D TOF pixel is the aforementioned near-infra red (NIR) photon penetration in the silicon. While the demodulation generally takes place close to the front side of the silicon surface, the electrons need to be first of all detected deeply in the silicon and secondly transferred quickly to the corresponding storage node.

In FSI imager sensors, the depletion region usually reaches depths into the silicon of a few microns, depending on applied voltages and used implants. In BSI pixels however, the substrate 103 is preferably backthinned to e.g. less than 100 micrometers, and preferably to less than 50 micrometers and less than about 20 micrometers in some embodiments. Therefore even electrons generated deeply in the substrate 103 can be detected. Therefore, a backthinned BSI pixel becomes ideal for 3D TOF system working with NIR illumination.

Figure 3:
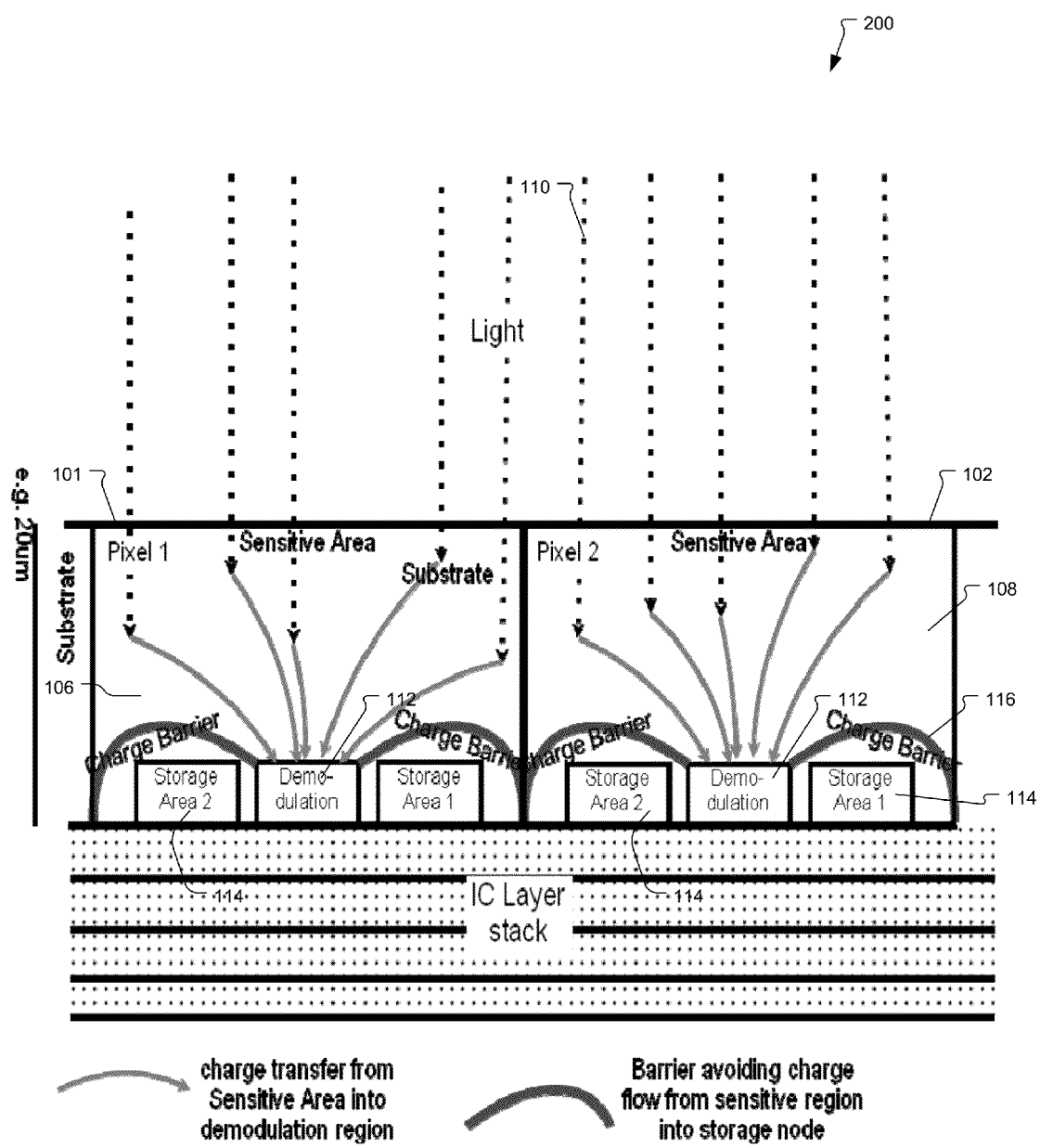
FIG. 3 is a diagram that illustrates an embodiment of the invention based on two demodulation pixels.

As shown in FIG. 3, an issue using BSI process for 3D TOF represents the storage of the electrons. While in standard intensity the imager sensitivity node is directly used as storage node, and 3D TOF pixels require clear physical separation of the photo-sensitive area and the storage nodes. On a BSI process, different implants are used to generate built-in drift fields that transfer the electrons generated in the substrate 103 towards the demodulation area 112 and only from there to the storage nodes 114. So, all photo-generated electrons have to pass the demodulation stage to finally get transferred into the appropriate storage node 114. Therefore, a barrier 116 has to be built to avoid leakage of electrons from the sensitive area 108 to the storage nodes 114.

FIG. 3 illustrates an exemplary embodiment of the inventive sensor 200 showing two pixels 101, 102. The device is illuminated from the back side. In the sensitive area 108, the impinging photons 110 generate electron-hole pairs. The electrons are transferred from the sensitive area 108 into the demodulation region 112. From there, the electrons are then directed to one of the storage nodes 114. The storage nodes 114 themselves are isolated from the sensitive area 108 by a charge barrier 116. That is, no charge carrier can flow from the sensitive area 108 into the storage sites 114.

The storage areas 114 have to be designed carefully. By the electron barrier 116, one can almost perfectly avoid the electron diffusion from the sensitive area 108 into the storage node 114, however, the generation of photo-electrons directly in the storage 114 node has to be minimized by design.

One option to reduce photo-electron generation in the storage node 114 is to use micro lenses 120, 122. The micro-lenses 120, 122 focus the light beam on the central sensitive area 108 of the pixel 102. Hence, photons getting into the storage area 114 are minimized or even completely avoided.

Figure 4:
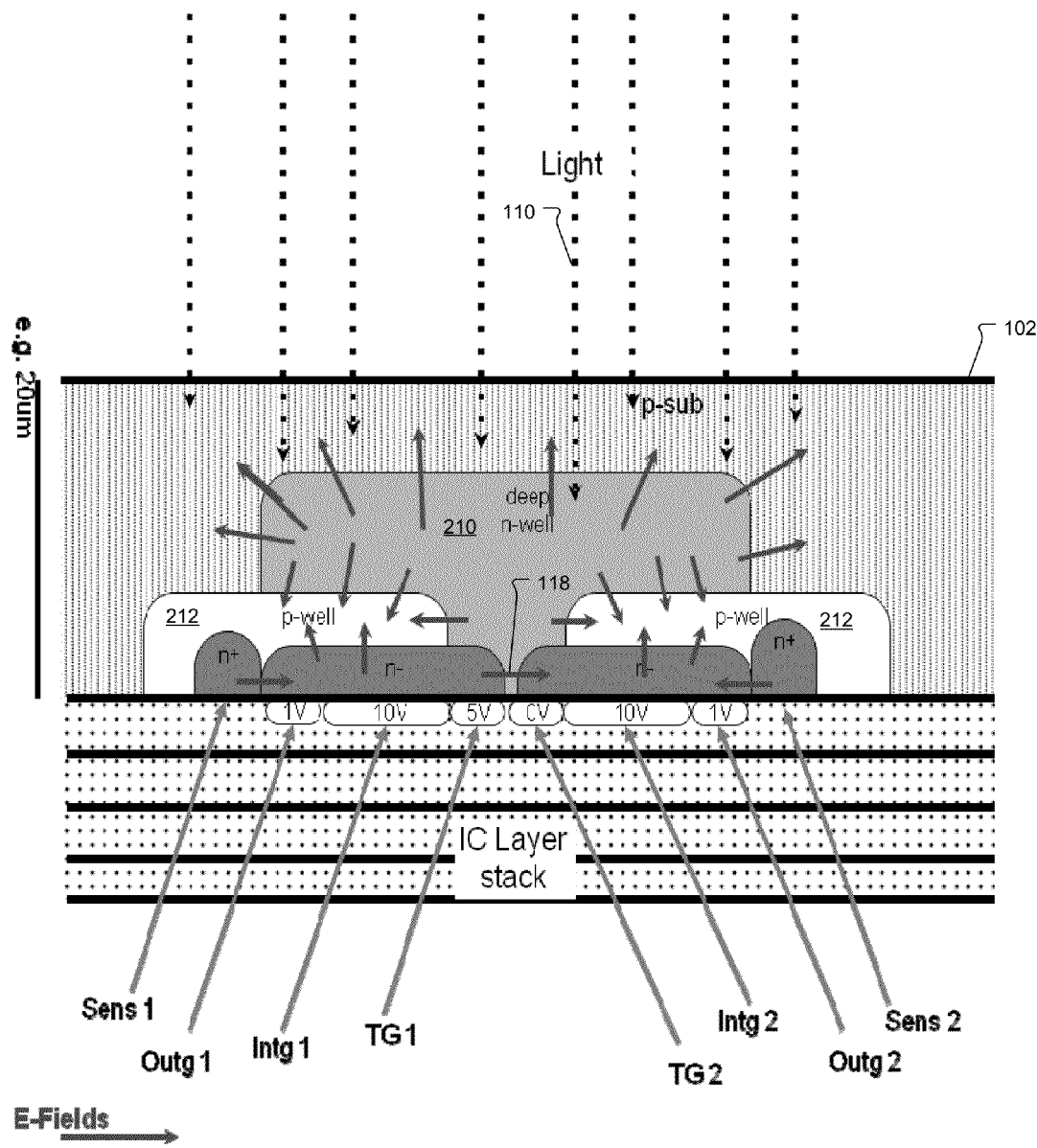
FIG. 4 is a diagram illustrating an embodiment of the invention for a back side illuminated demodulation pixel.

FIG. 4 illustrates an embodiment of the present invention based on electrons as charge carriers. However, the invention is not restricted to that. An embodiment illustrated in FIG. 4 shows built-in drift fields that transfer the electrons into the demodulation region 118, which is above transfer gate 1 (TG1) and transfer gate 2 (TG2). The barrier is created from a deep n-well 210 and shallow p-wells 212 over the storage nodes under integration gates Intg1, Intg2. This prevents charges from flowing from the sensitive area directly into the storage nodes, which are integration gate 1 (Intg1) and integration gate 2 (Intg2). The out-gates (Outg1, Outg2) serve as a barrier between the sense node diffusions (Sens1, Sens2) and the integration gates Intg1, Intg2. In the illustrated diagram, switching TG1 between 0V and 5V and TG2 inversely from 5V and 0V, the electrons arriving in the demodulation region 118 are steered into either the storage node 1 (Intg1) or the storage node 2 (Intg2). Therefore, switching TG1 and TG2 enables high speed sampling of the photo-generated electrons.

Figure 5:
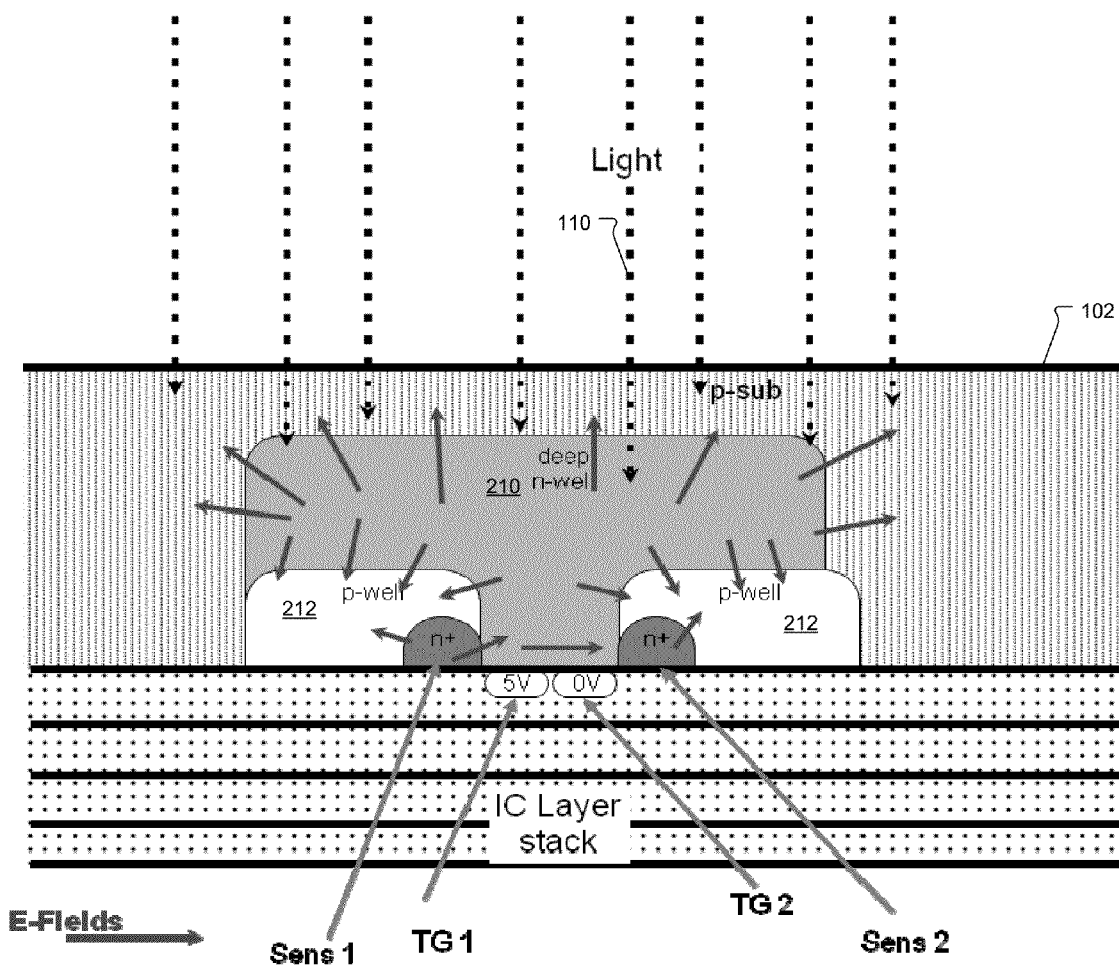
FIG. 5 is a diagram illustrating an embodiment of the invention for a back side illuminated demodulation pixel without integration gates.

FIG. 5 illustrates an alternative embodiment, where the charges are directly transferred from the demodulation region into two diffusion nodes Sens1, Sens2. The demodulation is still done on transfer gates TG1, TG2. As before, the deep n-well 210 and p-wells 212 prevent charge from directly entering the diffusion nodes Sens1, Sens2.

Figure 6:
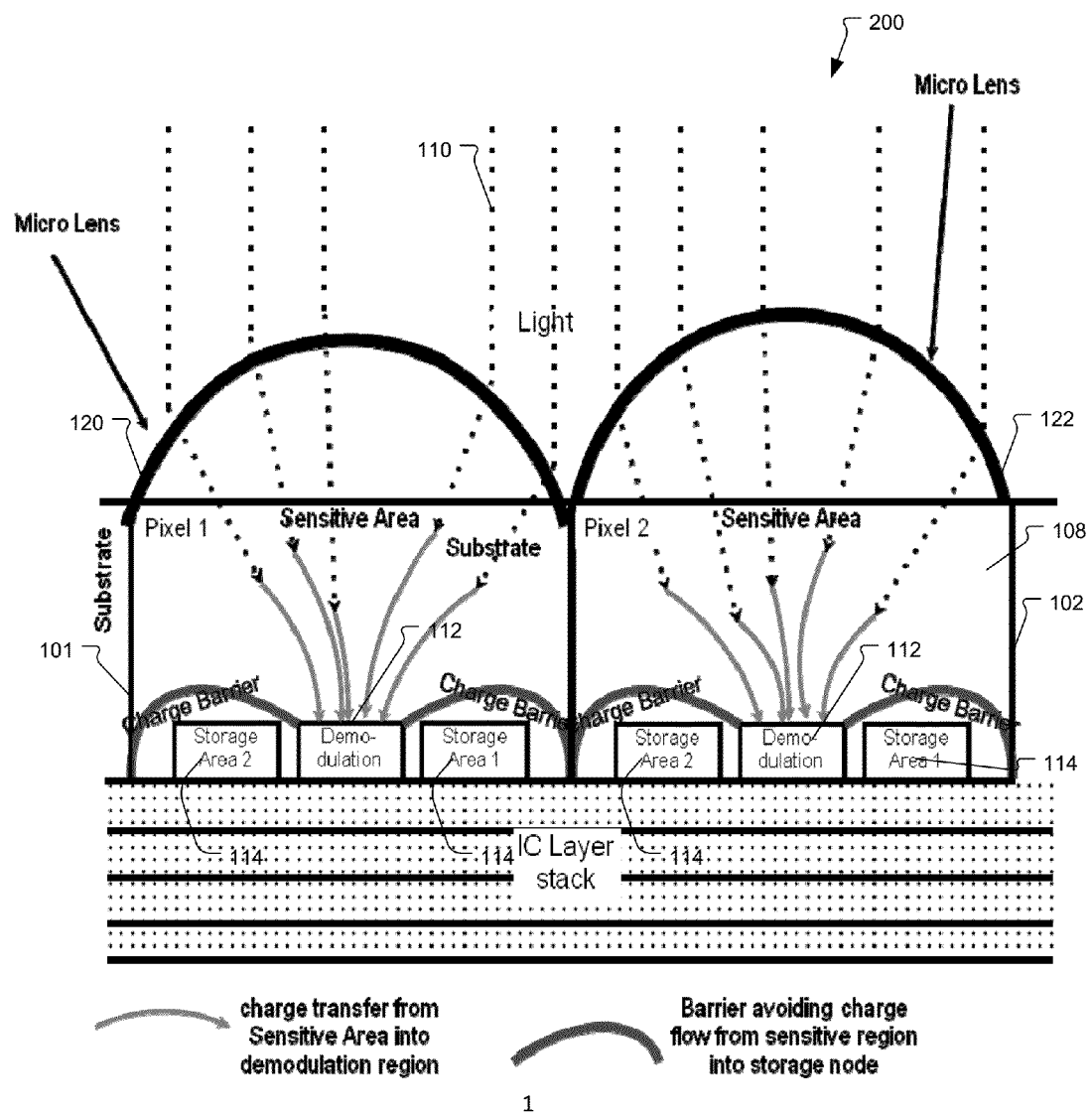
FIG. 6 is a diagram illustrating an embodiment that includes micro lenses to better focus the light on the sensitive area.

FIG. 6 illustrates an alternative embodiment that includes micro lenses 120, 122 attached or formed on the backside of the substrate of the sensor 200. As illustrated in FIG. 6, the light rays are now better deflected to the sensitive area 108. This reduces the probability that "photo-charges" are directly generated in the storage sites 114, before passing through the demodulation stage 112.

Figure 7:
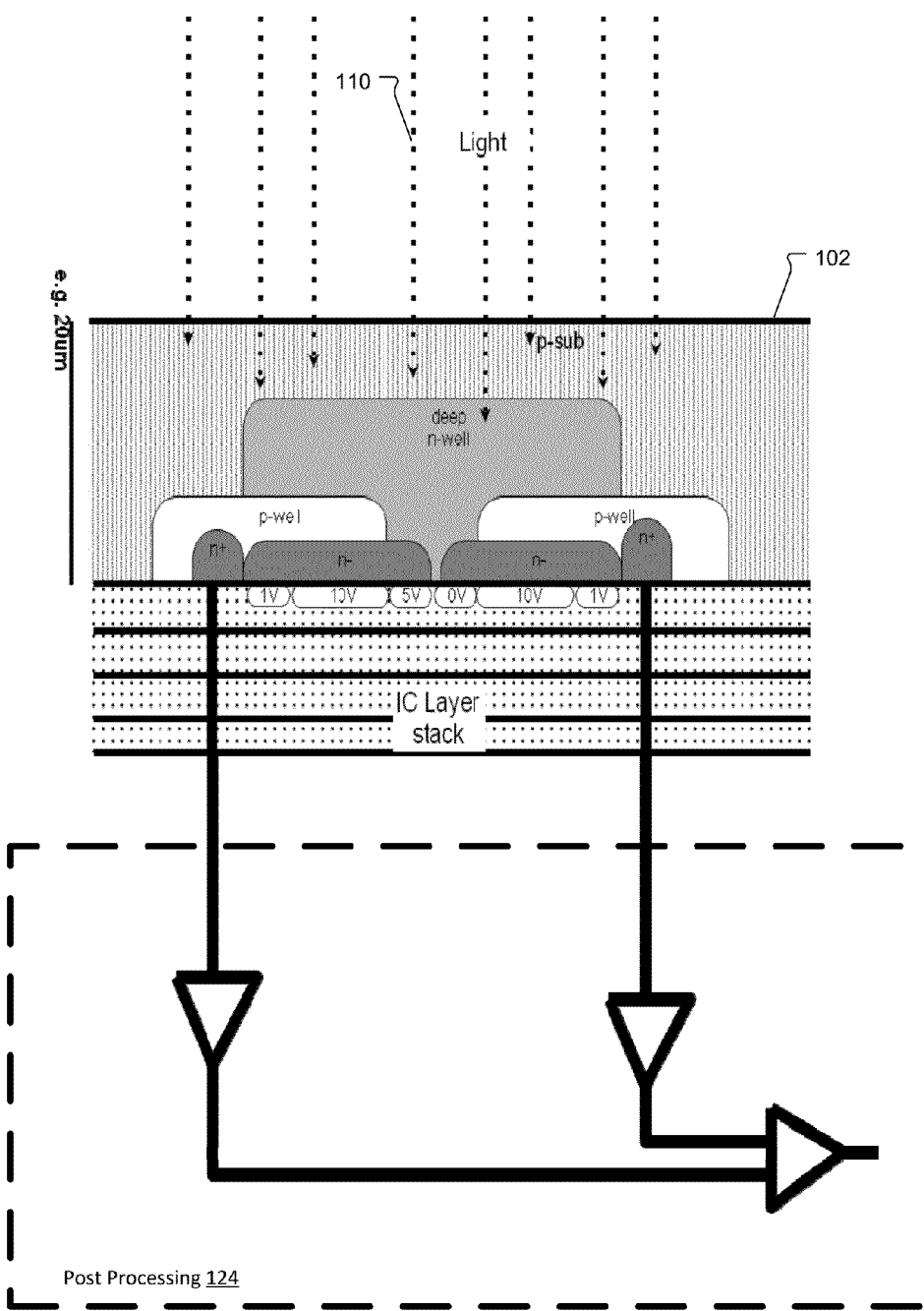
FIG. 7 is a diagram illustrating the back side illuminated pixel with post-processing performed on the sample values.

FIG. 7 illustrates an alternative embodiment wherein the samples of the pixel are post-processed before read out. Typically post-processing 124 includes subtracting the charges/voltages from two nodes or amplifying the output to increase the dynamic range, i.e. reduction of noise or increase of saturation level. However, in alternative embodiments other methods of post processing are performed as well.

The invention described above shows a demodulation pixel implemented on a back side illumination (BSI) technology. The pixel is processed in a BSI technology and includes, a photo-sensitive area, where electron hole pairs are generated, electrical drift fields driving the electrons from the sensitive area to the demodulation region, a demodulation region, where the electrons are sampled and transferred to at least one storage and/or dump node, at least one storage node, which is electrically isolated from the sensitive area and will store the sampled electrons.

While this invention has been particularly shown and described with references to preferred embodiments thereof, it will be understood by those skilled in the art that various changes in form and details may be made therein without departing from the scope of the invention encompassed by the appended claims.

REFERENCES

[BUE06A] B. Büttgen, "Extending Time-of-Flight Optical 3D-Imaging to Extreme Operating Conditions", Ph.D. thesis, University of Neuchatel, 2006.
[BUE05A] B. Büttgen, "Device and method for the demodulation of modulated electromagnetic fields", Filing date: Oct. 19, 2005, WO 2007/045108A1.
[BUE04] B. Büttgen, "Large-area pixel for use in an image sensor", European Patent Application, Publication date: Feb. 8, 2006, EP 1 624 490 A1.
[BUE06B] B. Büttgen, F. Lustenberger and P. Seitz, "Demodulation Pixel Based on Static Drift Fields", IEEE Transactions on Electron Devices, 53(11):2741-2747, Nov. 2006.
[BUE05B] B. Büttgen, F. Lustenberger, P. Seitz, "Large-area pixel for use in an image sensor", Filing date: Jul. 18, 2005, WO 2006/012761 A1.
[FOS01] V. Berezin et al., "Lock In Pinned Photodiode Photodetector", Filed: May 29, 2001, U.S. Pat. No. 6,794,214 B2.
[SCH98] R. Schwarte, "Verfahren und Vorrichtung zur Bestimmung der Phasen-und/oder Amplitudeninformation einer elektromagnetischen Welle", Mar. 12, 1998, DE 197 04 496 A1.
[SCH99] R. Schwarte, "Vorrichtung und Verfahren zur Erfassung von Phase und Amplitude elektromagnetischer Wellen", Nov. 25, 1999, DE 198 21 974 A1.
[KAU04] R. Kaufmann and M. Lehmann, "Image sensor with large-area, high-sensitivity and high-speed pixels", Date of publication Oct. 5, 2005, EP 1 583 150 A1.
[SEI02] P. Seitz, "Four-tap demodulation pixel", Date of filing: Jun. 20, 2002, GB 2 389 960 A.
[NIE05] D. van Nieuwenhove et al., "Novel Standard CMOS Detector using Majority Current for guiding Photo-Generated Electrons towards Detecting Junctions", Proceedings Symposium IEEE/LEOS Benelux Chapter, 2005.
[SPI99] T. Spirig, "Apparatus and method for detection of an intensity-modulated radiation field", Jan. 5, 1999, U.S. Pat. No. 5,856,667.
[KAW06] T. Ushinaga et al., "A QVGA-size CMOS time-of-flight range image sensor with background light charge draining structure", Three-dimensional image capture and applications VII, Proceedings of SPIE, Vol. 6056, pp. 34-41, 2006.
[SIN78] Amitabha Sinha and S. K. Chattopadhyaya, "Effect of Heavy Doping on the Properties of High-Low Junction", IEEE Transactions on Electron Devices, Vol. Ed-25, No. 12, Dec. 1978.
[SIN77] Amitabha Sinha and S. K. Chattopadhyaya, "Effect of back surface field on photocurrent in a semiconductor junction", Solid-State Electronics, Vol. 21, pp. 943-951, 1977.
[RHO09] H. Rhodes et al. "The mass production of BSI CMOS Image Sensors"; International Image Sensor Workshop, 2009.
[GAM09] J. Gambino et al., "CMOS Image Sensor with High Refractive Index Lightpipe", International Image Sensor Workshop, 2009.
[AGA09] G. Agranov et al., "CMOS pixel continues to Shrink . . . Pixel Development for Novel CMOS Image Sensors", International Image Sensor Workshop, 2009.
[LAN01] T. Lange and P. Seitz, "Solid-state Time-of-Flight Range Camera", IEEE J. Quantum Electronics, Vol. 37 (3), 390-397, Mar. 1, 2001.
[Ogg05] T. Oggier, B. Büttgen, F. Lustenberger, G. Becker, B. Ruegg, A. Hodac, B, "SwissRanger SR3000 and First Experiences Based on Miniaturized 3D TOF Camera", Range Imaging Days, 2005, Zurich Switzerland.
[NIC03] C. Niclass, A. Rochas, P. A. Besse, E. Charbon, "A CMOS Single Photon Avalanche Diode Array for 3D Imaging", IEEE International Solid-State Circuits Conference (ISSCC), pp. 120-121, Feb. 2004.
[OGG04] T. Oggier, M. Lehmann P. Metzler, G. Lang, M. Schweizer, M. Richter, B. Büttgen, N. Blanc, K. Griesbach, B Uhlmann, K.-H. Stegemann, C. Ellmers, "3D-Imaging in Real-Time with Miniaturized Optical Range Camera", Opto Conference Nurnberg, 2004.

What is claimed is:

1. A demodulation sensor with backside illumination, the sensor comprising:
an array of pixels formed in a semiconductor substrate having a first impurity type; and
a layer stack formed over a frontside of the substrate and over the array of pixels wherein photons are received from a backside of the substrate, which is opposite the frontside, into the array of pixels,
wherein each of the pixels comprises:
a photo-sensitive area comprising a deep well in the substrate for receiving the photons from the backside, the deep well having a second impurity type opposite that of the first impurity type, the photons generating charges that are transferred to a single contiguous demodulation area of the deep well;
a switching element that directs said charges from said demodulation area to alternative storage areas; and
a charge barrier to prevent said charges from flowing directly from said photo-sensitive area to said storage areas other than by way of the demodulation area, wherein the charge barrier comprises wells of the first impurity type and the deep well of the second impurity type.

2. The demodulation sensor of claim 1, further including a lens to direct said photons toward the demodulation area.

3. The demodulation sensor of claim 1, wherein said charge flow from said storage areas into diffusion nodes.

4. The demodulation sensor of claim 3, wherein a barrier controls the flow of charge from said storage area to said diffusion nodes.

5. The demodulation sensor of claim 3, further including a post processing unit.

6. The demodulation sensor of claim 5, wherein said post processing unit subtracts the voltage from two diffusion nodes.

7. The demodulation sensor of claim 5, wherein said post processing unit amplifies the output of diffusion nodes.

8. The demodulation sensor of claim 1, wherein said substrate is a silicon substrate.

9. The demodulation sensor of claim 8, wherein said silicon substrate is backthinned to thickness of less than 100 micrometers.

10. The demodulation sensor of claim 1 comprising
a plurality of lenses on the backside corresponding respectively to each of the pixels, wherein each lens directs photons toward the demodulation area of the corresponding pixel.

* * * * *